(12) United States Patent
Cui

(10) Patent No.: US 11,626,458 B2
(45) Date of Patent: Apr. 11, 2023

(54) TRANSPARENT DISPLAY PANEL AND METHOD FOR MANUFACTURING THE SAME, DISPLAY DEVICE

(71) Applicant: BOE TECHNOLOGY GROUP CO., LTD., Beijing (CN)

(72) Inventor: Ying Cui, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 194 days.

(21) Appl. No.: 17/032,403

(22) Filed: Sep. 25, 2020

(65) Prior Publication Data
US 2021/0091155 A1 Mar. 25, 2021

(30) Foreign Application Priority Data
Sep. 25, 2019 (CN) .......................... 201910911886.8

(51) Int. Cl.
*H01L 27/32* (2006.01)
*H01L 51/56* (2006.01)

(52) U.S. Cl.
CPC .......... *H01L 27/3246* (2013.01); *H01L 51/56* (2013.01); *H01L 2227/323* (2013.01)

(58) Field of Classification Search
CPC ........................... H01L 27/3246; H01L 51/56; H01L 2227/323
(Continued)

(56) References Cited

U.S. PATENT DOCUMENTS

2004/0144975 A1* 7/2004 Seki .................... H01L 51/0007
257/40

2006/0244369 A1* 11/2006 Eiichi ................ H01L 27/3246
313/504
(Continued)

FOREIGN PATENT DOCUMENTS

CN 104362169 A 2/2015
CN 106158739 A 11/2016
(Continued)

OTHER PUBLICATIONS

Second Office Action for related CN Application No. 201910911886.8 dated Nov. 22, 2021; English translation of CN OA provided, 25 pages.
(Continued)

*Primary Examiner* — Dzung Tran
(74) *Attorney, Agent, or Firm* — Procopio, Cory, Hargreaves & Savitch LLP

(57) ABSTRACT

A transparent display panel includes a base, a first pixel defining structure and a first light-emitting devices. The first pixel defining structure is disposed on the base and includes a first opening that has a light transmission region and a light-emitting region. The first light-emitting device is disposed on the base and includes an opaque electrode and a light-emitting functional layer. At least part of the opaque electrode is exposed by the first opening, and an orthographic projection of the opaque electrode does not overlap with the light transmission region. The light-emitting functional layer is disposed in the first opening and defined by the first opening. The orthographic projection of the opaque electrode and an orthographic projection of the light-emitting functional layer have an overlapping region, and at least a portion of the overlapping region is within the light-emitting region.

16 Claims, 11 Drawing Sheets

(58) Field of Classification Search
    USPC .......................................................... 257/40
    See application file for complete search history.

(56) References Cited

U.S. PATENT DOCUMENTS

| | | | | |
|---|---|---|---|---|
| 2009/0321725 | A1* | 12/2009 | Yoshida | H01L 27/1214 257/E21.414 |
| 2016/0043161 | A1* | 2/2016 | Miyazawa | H01L 27/3246 257/40 |
| 2016/0254455 | A1* | 9/2016 | Wang | H01L 51/0029 438/23 |
| 2016/0359142 | A1* | 12/2016 | Huangfu | H01L 51/001 |
| 2017/0213871 | A1 | 7/2017 | Chen et al. | |
| 2019/0267563 | A1 | 8/2019 | Paek et al. | |
| 2021/0175302 | A1 | 6/2021 | Cui | |

FOREIGN PATENT DOCUMENTS

| | | |
|---|---|---|
| CN | 108281574 A | 7/2018 |
| CN | 207651487 U | 7/2018 |
| CN | 108493230 A | 9/2018 |
| CN | 108565357 A | 9/2018 |
| CN | 108962936 A | 12/2018 |
| CN | 109859649 A | 6/2019 |
| CN | 109860223 A | 6/2019 |
| CN | 109887961 A | 6/2019 |
| CN | 110211990 A | 9/2019 |
| EP | 3026708 A1 | 6/2016 |
| EP | 3719843 A1 | 10/2020 |
| EP | 3806156 A1 | 4/2021 |
| KR | 20180003335 A | 1/2018 |
| WO | 2018196271 A1 | 11/2018 |

OTHER PUBLICATIONS

Office Action dated Jun. 24, 2021 from corresponding CN Patent Application No. 201910911886.8, 27 pages.

\* cited by examiner

TRANSPARENT DISPLAY PANEL AND METHOD FOR MANUFACTURING THE SAME, DISPLAY DEVICE

CROSS-REFERENCE TO RELATED APPLICATION

This application claims priority to Chinese Patent Application No. 201910911886.8, filed Sep. 25, 2019, which is incorporated herein by reference in its entirety.

TECHNICAL FIELD

The present disclosure relates to the field of display technologies, and in particular, to a transparent display panel and a method for manufacturing the same, and a display device.

BACKGROUND

In a process of forming organic light-emitting diodes (OLEDs), an ink-jet printing technology can be used to provide solutions such as a solution of a hole-transporting material (e.g., poly(3,4-ethylenedioxythiophene)/poly (styrenesulfonate), PEDOT/PSS), and solutions of organic light-emitting materials of red, green and blue colors (i.e., three primary colors) into pre-formed sub-pixel openings with micron-sized print heads, so as to form sub-pixels of the three primary colors. A thickness of a light-emitting functional layer in the sub-pixel is determined by an amount of the solutions provided in the sub-pixel opening. By using the ink-jet printing technology, the expensive organic light-emitting materials may be saved, and the producing time may be shortened.

SUMMARY

In an aspect, a transparent display panel is provided. The transparent display panel includes a base, a first pixel defining structure and a first light-emitting device. The first pixel defining structure disposed on the base. The first pixel defining structure includes a first opening, and the first opening has a light transmission region and a light-emitting region. The first light-emitting device is disposed on the base. The first light-emitting device includes an opaque electrode and a light-emitting functional layer. At least part of the opaque electrode is exposed by the first opening, and an orthographic projection of the opaque electrode on the base does not overlap with the light transmission region. The light-emitting functional layer is disposed in the first opening and is defined by the first opening, the opaque electrode and the light-emitting functional layer are stacked in a thickness direction of the base. The orthographic projection of the opaque electrode on the base and an orthographic projection of the light-emitting functional layer on the base have an overlapping region, and at least a portion of the overlapping region is within the light-emitting region.

In some embodiments, the transparent display panel further includes a second pixel defining structure disposed on a side of the opaque electrode away from the base and located in the first opening. The second pixel defining structure includes a second opening exposing the opaque electrode; an orthographic projection of the opaque electrode on the base is within an outer border of an orthographic projection of the second pixel defining structure on the base, and a region in the first opening that is not occupied by both the second pixel defining structure and the opaque electrode is within the light transmission region. In the thickness direction of the base, a thickness of at least a portion of the second pixel defining structure between the light-emitting region and the light transmission region is less than a thickness of the first pixel defining structure.

In some embodiments, in the thickness direction of the base, a distance from a surface of the second pixel defining structure facing away from the base to a surface of the base facing the second pixel defining structure is greater than a distance from a surface of the opaque electrode facing away from the base to the surface of the base facing the second pixel defining structure.

In some embodiments, the thickness of the second pixel defining structure is less than the thickness of the first pixel defining structure.

In some embodiments, a remaining portion of the second pixel defining structure except the portion of the second pixel defining structure between the light-emitting region and the light transmission region is in contact with the first pixel defining structure.

In some embodiments, the second pixel defining structure and the first pixel defining structure are disposed in a same layer.

In some embodiments, the first pixel defining structure is made of an organic material. The second pixel defining structures is made of an organic material or an inorganic material.

In some embodiments, the second pixel defining structure is made of a transparent material.

In some embodiments, the first light-emitting device further includes a second electrode, and the opaque electrode, the light-emitting functional layer and the second electrode are sequentially stacked in a direction away from the base.

In some embodiments, the second electrode is a metal electrode that is transparent or translucent.

In some embodiments, the first pixel defining structure further includes a third opening. The transparent display panel further includes a second light-emitting device disposed on the base. The second light-emitting device includes a second opaque electrode and a second light-emitting functional layer. An orthographic projection of the third opening on the base is within an orthographic projection of the second opaque electrode on the base. The second opaque electrode and the second light-emitting functional layer are stacked in the thickness direction of the base, and the second light-emitting functional layer is disposed in the third opening and defined by the third opening.

In another aspect, a display device including the above transparent display panel is provided.

In yet another aspect, a method of manufacturing the above transparent display panel is provided. The method includes: forming the opaque electrode in a region on the base where the first light-emitting device is to be formed; forming the first pixel defining structure on the base formed with the opaque electrode; the first pixel defining structure including the first opening that has the light transmission region and the light-emitting region, the orthographic projection of the opaque electrode on the base not overlapping with the orthographic projection of the light transmission region on the base; and forming the light-emitting functional layer in the first opening, so as to form the first light-emitting device, wherein the orthographic projection of the opaque electrode on the base and the orthographic projection of the light-emitting functional layer on the base have the overlapping region, and at least a portion of the overlapping region is within the light-emitting region.

In some embodiments, before forming the light-emitting functional layer in the first opening, the method further includes forming a second pixel defining structure on the base. The second pixel defining structure is located in the first opening, and includes a second opening exposing the opaque electrode; the orthographic projection of the opaque electrode on the base is within an outer border of an orthographic projection of the second defining structure on the base, and a region in the first opening that is not occupied by both the second pixel defining structure and the opaque electrode is within the light-emitting region; and in the thickness direction of the base, a thickness of at least a portion of the second pixel defining structure between the light-emitting region and the light transmission region is less than a thickness of the first pixel defining structure.

In some embodiments, the first pixel defining structure and the second pixel defining structure are formed through a same patterning process.

In some embodiments, after forming the light-emitting functional layer in the first opening, the method further includes: forming a second electrode on the light-emitting functional layer.

In some embodiments, forming the light-emitting functional layer in the first opening includes: forming the light-emitting functional layer in the first opening through an inkjet printing process.

In some embodiments, the first pixel defining structure further includes a third opening; and the transparent display panel further includes a second light-emitting device. The method further includes: forming the second light-emitting device in a region on the base except the region where the first light-emitting device is formed. The second light-emitting device includes a second opaque electrode and a second light-emitting functional layer that are stacked in the thickness direction of the base; and the second light-emitting functional layer is disposed in the third opening and defined by the third opening.

In some embodiments, the second light-emitting device and the first light-emitting device are simultaneously formed.

BRIEF DESCRIPTION OF THE DRAWINGS

In order to describe technical solutions in embodiments of the present disclosure more clearly, accompanying drawings to be used in some embodiments of the present disclosure will be introduced briefly. However, the accompanying drawings to be described below are merely accompanying drawings of some embodiments of the present disclosure, and a person of ordinary skill in the art may obtain other drawings according to these drawings. In addition, the accompanying drawings to be described below may be regarded as schematic diagrams, and are not limitations on actual sizes of products, an actual process of a method and actual timings of signals to which the embodiments of the present disclosure relate.

DETAILED DESCRIPTION

Figure 1A:
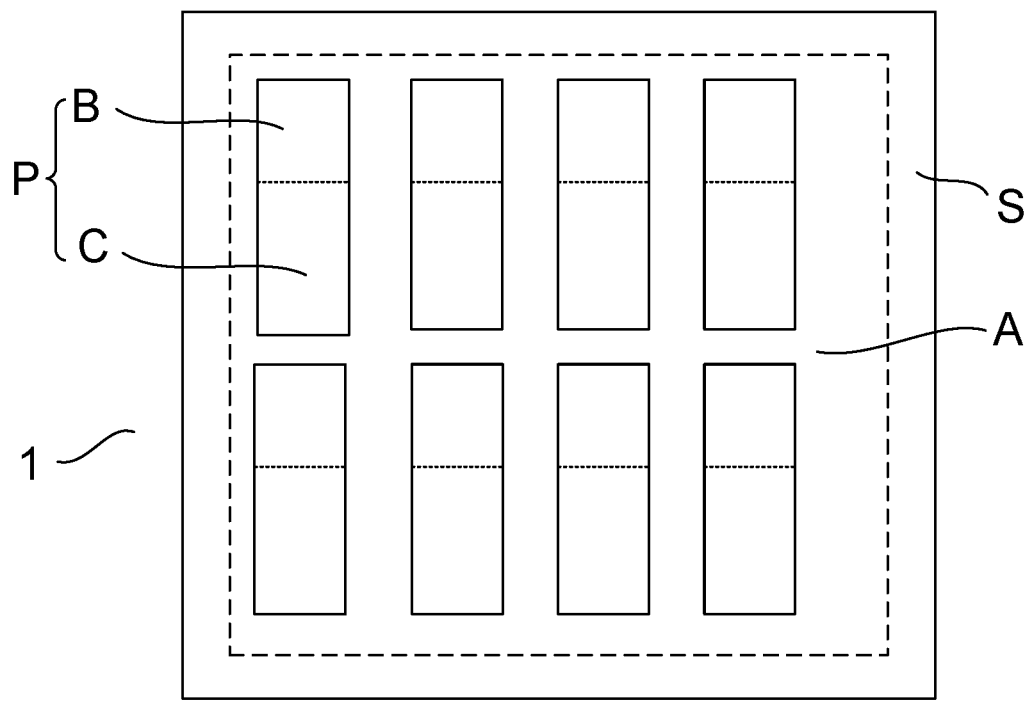
FIG. 1A is a top view of a transparent display panel, in accordance with some embodiments.

Technical solutions in some embodiments of the present disclosure will be described clearly and completely with reference to accompanying drawings below. Obviously, the described embodiments are merely some but not all of the embodiments of the present disclosure. All other embodiments obtained on a basis of the embodiments of the present disclosure by a person of ordinary skill in the art shall be included in the protection scope of the present disclosure.

In the description of embodiments of the invention, it will be understood that orientations or positional relationships indicated by terms "center", "upper", "lower", "front", "rear", "left", "right", "vertical", "horizontal", "top", "bottom", "inner", "outer", etc. are based on orientations or positional relationships shown in the drawings, which merely to facilitate and simplify the description of embodiments of the invention, but not to indicate or imply that the referred devices or elements must have a particular orientation, or must be constructed or operated in a particular orientation. Therefore they should not be construed as limitations to the invention.

Unless the context requires otherwise, the term "comprise" and other forms thereof such as the third-person singular form "comprises" and the present participle form "comprising" in the description and the claims are construed as open and inclusive, i.e., "inclusive, but not limited to". In the description of the description, terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to same embodiment(s) or example(s). In addition, the specific features, structures, materials or characteristics may be included in any one or more embodiments or examples in any suitable manner.

The terms such as "first" and "second" are used for descriptive purposes only, and are not to be construed as indicating or implying relative importance or implicitly indicating the number of indicated technical features. Therefore, features defined as "first" and "second" may explicitly or implicitly include one or more of the features. In the description of the embodiments of the present disclosure, the term "a plurality of" means two or more unless otherwise specified.

It is to be understood that the singular includes plural referents unless the context clearly dictates otherwise. Thus, for example, reference to "a first opening" includes reference to one or more of such openings.

In the description of some embodiments, the term "connected" and its extensions may be used. For example, the term "connected" may be used in the description of some embodiments to indicate that two or more components are in direct physical or electrical contact with each other. The term "connected" may also be used in the description of some embodiments to indicate that two or more components are in indirect physical or electrical contact with each other. The embodiments disclosed herein are not necessarily limited to the content herein.

Use of the phrase "configured to" is meant as an open and inclusive language, which does not exclude devices configured to perform additional tasks or steps.

Exemplary embodiments are described herein with reference to cross-sectional diagrams and/or plan diagrams as idealized exemplary drawings. In the drawings, thicknesses of layers and regions may be exaggerated for clarity. Therefore, variations in shapes with respect to the drawings due to, for example, manufacturing techniques and/or tolerances are conceivable. Therefore, the exemplary embodiments should not be construed as being limited to the shapes of the regions shown herein, but include shape deviations due to, for example, manufacturing. Therefore, the regions illustrated in the drawings are schematic and their shapes are not intended to illustrate the actual shapes of the regions in an apparatus and are not intended to limit the scope of the exemplary embodiments. "A and/or B" includes the following combinations of A and B: only A, only B, and a combination of A and B.

Figure 1B:
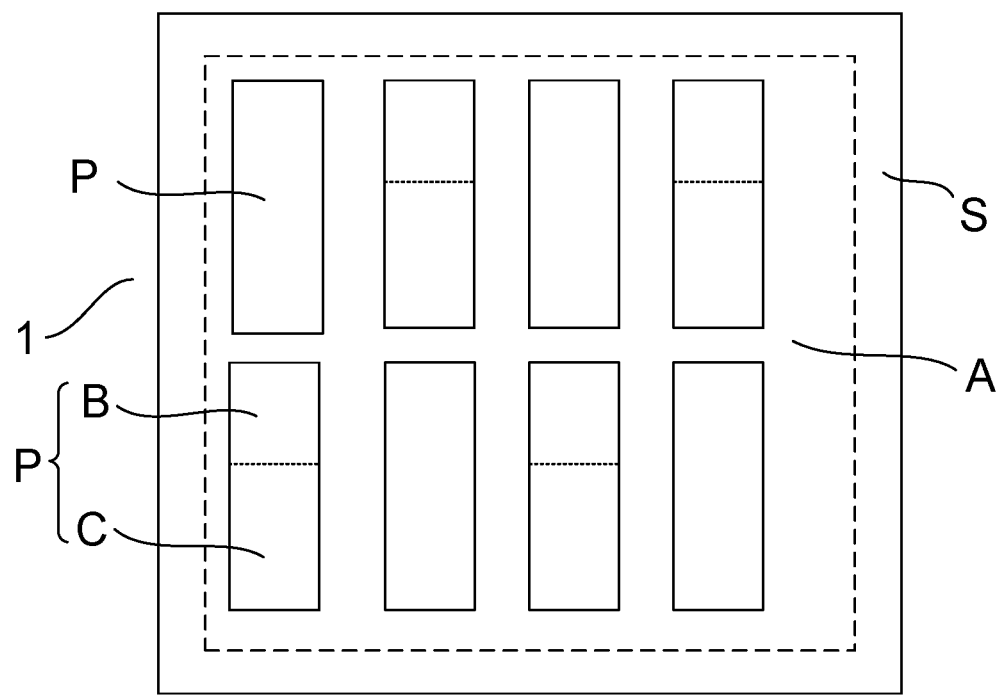
FIG. 1B is a top view of another transparent display panel, in accordance with some embodiments.

As shown in FIGS. 1A and 1B, some embodiments of the present disclosure provide a display device, which includes a transparent display panel 1, for example, a high-resolution transparent display panel.

The transparent display panel 1 has an active area A and a peripheral region S. The peripheral region S is arranged on a periphery of the active area A. For example, as shown in FIGS. 1A and 1B, the peripheral region S is arranged around the active area A. Alternatively, the active area A is in a shape of a rectangle, and the peripheral region S may be arranged on one side or two opposite sides of the active area A. Of course, the active area A may have other shapes, such as a circular shape.

The transparent display panel 1 includes a plurality of sub-pixels disposed in the active area A, and a region where a sub-pixel is located may be called a sub-pixel region P.

The transparent display panel 1 may further include a plurality of wires or lines disposed in the peripheral region S, and the wires or lines are electrically connected to the sub-pixels in the active area A. For example, the wires or lines include leads connected to gate lines in the active area A, leads connected to data lines in the active area A, and power lines, and the gate lines and the data lines are connected to the sub-pixels. The transparent display panel 1 may further include a plurality of bonding electrodes or at least one driver circuit (e.g., a gate driver circuit) disposed in the peripheral region S.

Figure 2A:
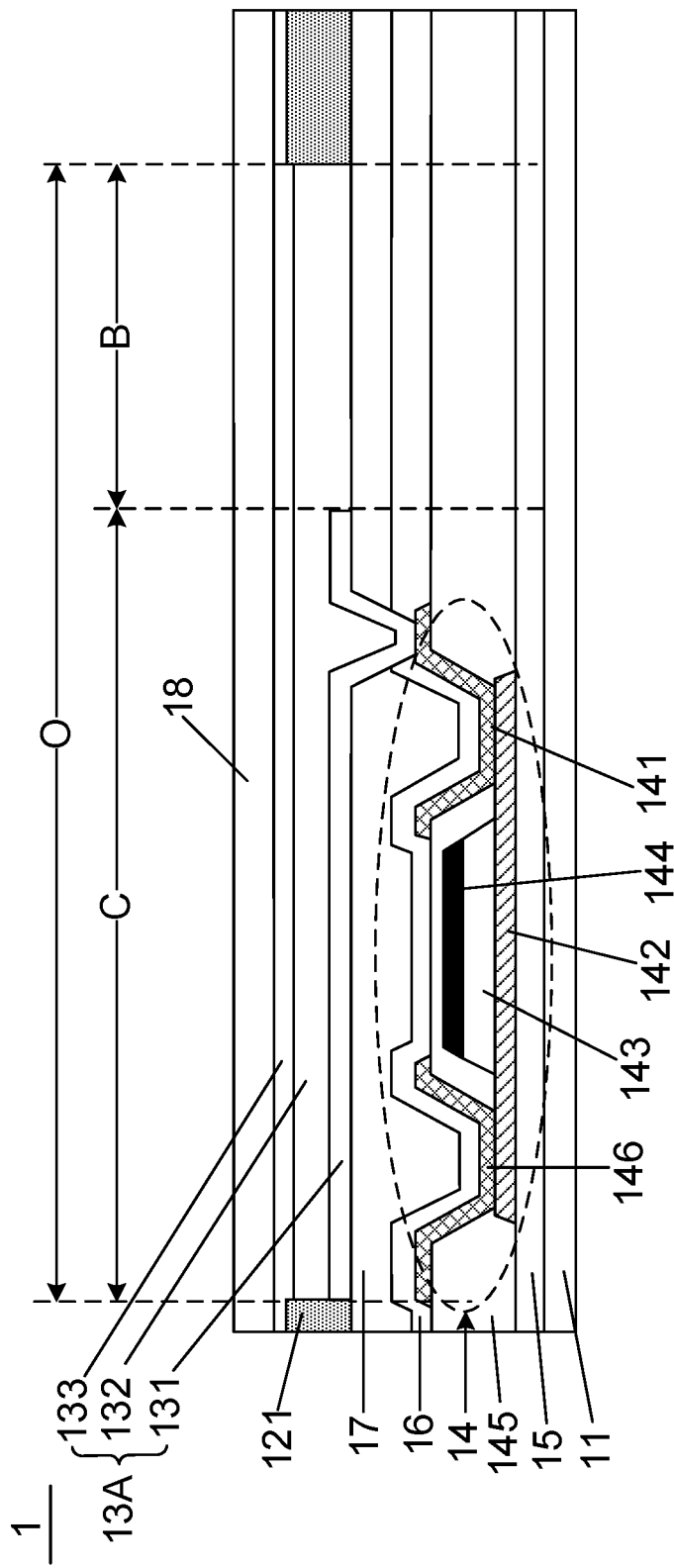
FIG. 2A is a cross-sectional view of a transparent display panel, in accordance with some embodiments.

In some embodiments, as shown in FIG. 2A, the transparent display panel 1 includes a base 11, and a first pixel defining structure 121 and a plurality of first light-emitting devices 13A that are disposed on the base 11. The first pixel defining structure 121 includes a plurality of first openings O each located in a corresponding sub-pixel region P of the plurality of sub-pixel regions P.

As shown in FIGS. 1A, 1B and 2A, each first opening O includes a light transmission region B and a light-emitting region C.

It will be noted that, the light-emitting region C refers to a region from which light can be emitted. The light transmission region B refers to a region through which light can pass. In other words, the light can pass through the transparent display panel 1 via the light transmission region B.

As shown in FIG. 2A, the first light-emitting device 13A includes an opaque electrode 131 and a light-emitting functional layer 132 that are stacked in a thickness direction of the base 11. The opaque electrode 131 is disposed on the base 11. At least part of the opaque electrode 131 is exposed by a corresponding first opening O, and an orthographic projection of the opaque electrode 131 on the base 11 does not overlap with a corresponding light transmission region B. The light-emitting functional layer 132 is disposed in the first opening O and is defined by the first opening O. An orthographic projection of the opaque electrode 131 on the base 11 and an orthographic projection of the light-emitting functional layer 132 on the base 11 have an overlapping region, and at least a portion of the overlapping region is within the light-emitting region C. The orthographic projection of the opaque electrode 131 on the base 11 does not overlap with the light transmission region B.

It will be understood that, that "the light-emitting functional layer 132 is disposed in the first opening O" means that, a portion of the light-emitting functional layer 132 is located in the light-emitting region C and another portion of the light-emitting functional layer 132 is located in the light transmission region B. Since orthographic projections of the light-emitting functional layer 132 and the opaque electrode 131 on the base 11 has no overlapping region in the light transmission region B (i.e., the opaque electrode 131 has no portion in the light transmission region B), the portion of the light-emitting functional layer 132 located in the light transmission region B do not emit light.

In the transparent display panel 1 described above, the light-emitting functional layer 132 is disposed in both the light-emitting region C and the light transmission region B. Therefore, compared with a light-emitting functional layer which is only formed in the light-emitting region, a space in the above transparent display panel 1 used for forming the light-emitting functional layer 132 (i.e., the first opening O) may be larger. Accordingly, the light-emitting functional layer 132 is formed in the larger space, which may reduce process difficulty. For example, in a case where the transparent display panel 1 is a high-resolution transparent display panel manufactured through an ink-jet printing process, requirement for accuracy of the ink-jet printing device may be reduced, thereby reducing process difficulty.

Figure 2B:
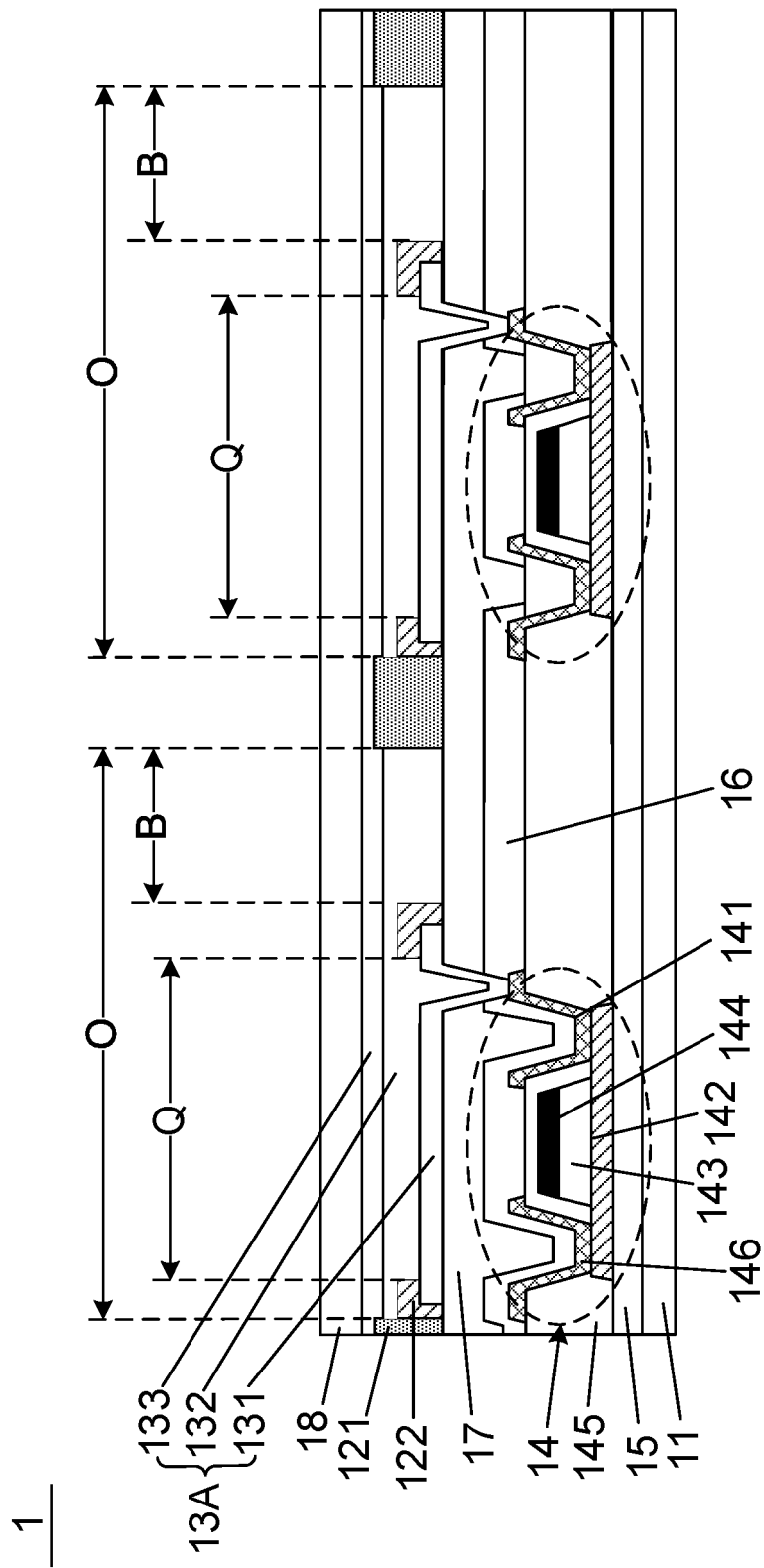
FIG. 2B is a cross-sectional view of another transparent display panel, in accordance with some embodiments.

In some embodiments, as shown in FIG. 2B, the transparent display panel 1 further includes a plurality of second pixel defining structures 122. The second pixel defining structure 122 is illustrated below by taking the structure of the transparent display panel on the left in FIG. 2B as an example. The second pixel defining structure 122 is disposed on a side of the opaque electrode 131 away from the base 11, and is located in the first opening O. The second pixel defining structure 122 includes a second pixel defining structure body, and a second opening Q passing through the second pixel defining structure body and exposing the opaque electrode 131. An orthographic projection of the opaque electrode 131 on the base 11 is within an outer border of an orthographic projection of the second pixel defining structure 122 on the base 11, and a region in the first opening O that is not occupied by both the second pixel defining structure 122 and the opaque electrode 131 is the light transmission region B.

It will be understood that, a region in the first opening O where each second opening Q is located can expose the opaque electrode 131, and thus this region is the light-emitting region C of the sub-pixel region P. That is, by arranging the second pixel defining structure 122 in the first opening O, the light-emitting region C may be defined by the second opening Q of the second pixel defining structure 122.

In some examples, in the thickness direction of the base 11, a thickness of at least a portion of the second pixel defining structure 122 between the light-emitting region C and the light transmission region B is less than a thickness of the first pixel defining structure 121.

In this way, it may be ensured that the light-emitting functional layer 132 formed in the first opening O is not divided by the second pixel defining structure body, and a surface of the light-emitting functional layer 132 facing away from the base 11 is a planar surface.

In some examples, as shown in FIGS. 2B, 3A, 3B, 4 and 5, in the thickness direction of the base 11, a thickness of the second pixel defining structure 122 is less than the thickness of the first pixel defining structure 121.

The thickness of the first pixel defining structure 121 may range from 0.5 μm to 3.0 μm. For example, the thickness of the first pixel defining structure 121 is 0.5 μm, 2.0 μm or 3.0 μm.

The thickness of the second pixel defining structure 122 may range from 0.1 μm to 1.0 μm. For example, the thickness of the second pixel defining structure 122 is 0.1 μm, 0.4 μm or 1.0 μm.

Figure 2C:
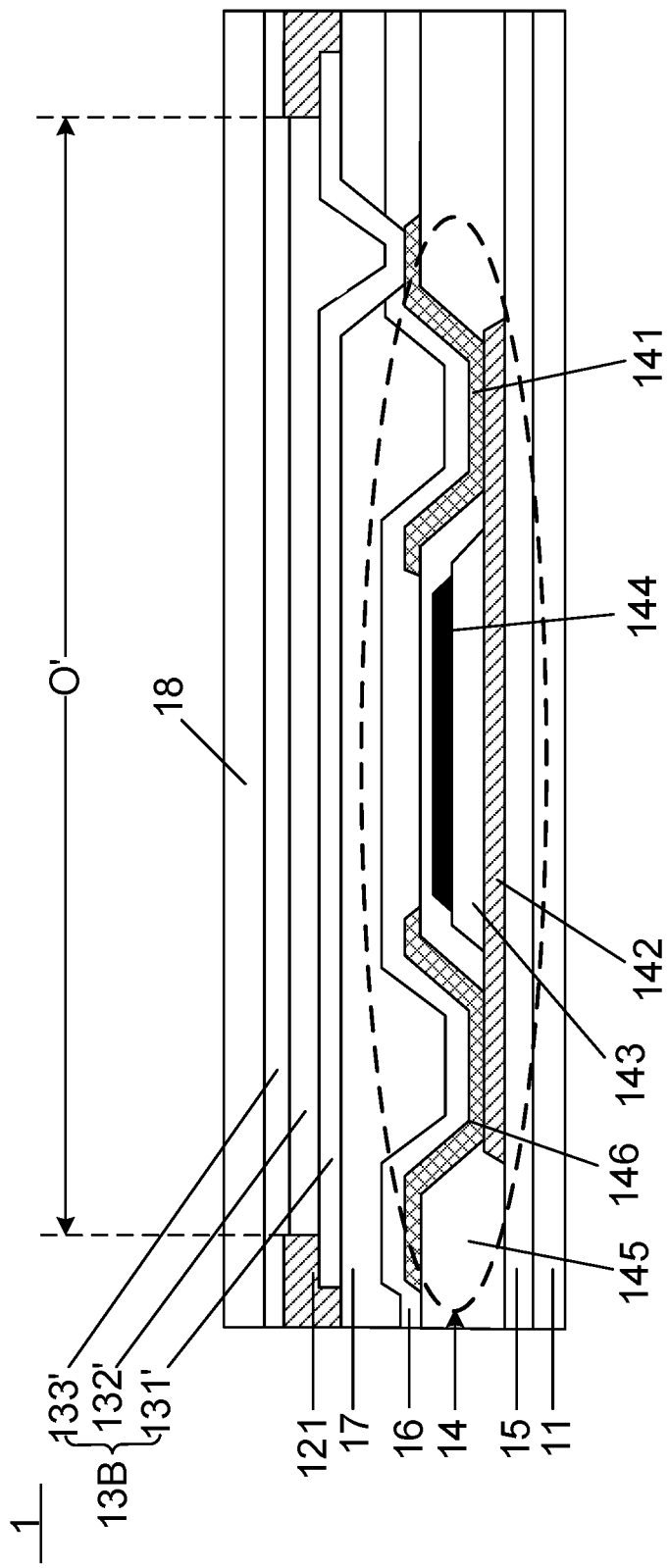
FIG. 2C is a cross-sectional view of yet another transparent display panel, in accordance with some embodiments.

In some embodiments, as shown in FIGS. 2B and 2C, in the thickness direction of the base 11, a distance from a surface of the second pixel defining structure 122 facing away from the base 11 to a surface of the base 11 facing the second pixel defining structure 122 is greater than a distance from a surface of the opaque electrode 131 facing away from the base 11 to the surface of the base 11 facing the second pixel defining structure 122.

For example, the second pixel defining structure 122 overlaps the opaque electrode 131 at at least one edge of the second pixel defining structure 122.

In this case, an area of the orthographic projection of the opaque electrode 131 on the base 11 is larger than an area of the light-emitting region C, and the portion of the opaque electrode 131 which extends beyond the light-emitting region C is covered by the second pixel defining structure 122. In this way, this portion of the opaque electrode 131 does not touch the light-emitting functional layer 132, and thus a region of the sub-pixel region P corresponding to this portion of the opaque electrode 131 can not emit light.

It will be noted that, in this case, the opaque electrode 131 is formed before the second pixel defining structure 122 is formed.

In some embodiments, as shown in FIGS. 3A, 3B, 4 and 5, a remaining portion of the second pixel defining structure 122 except the portion between the light-emitting region C and the light transmission region B is in contact with the first pixel defining structure 121.

Figure 3A:
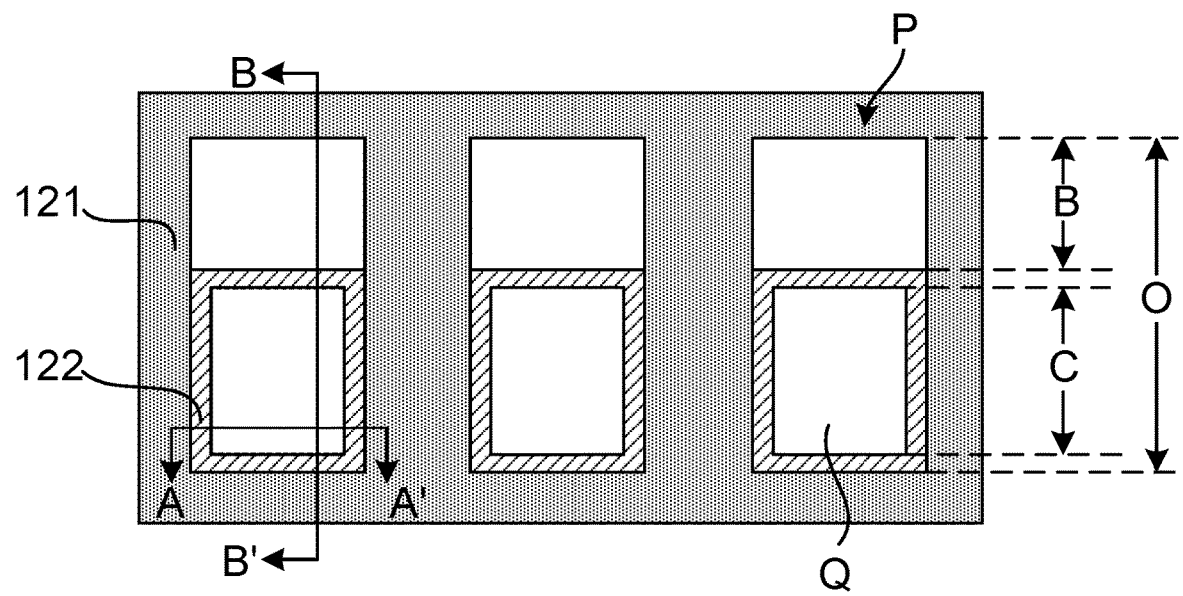
FIG. 3A is a top view showing a first pixel defining structure and second pixel defining structures in a transparent display panel, in accordance with some embodiments.

For example, as shown in FIG. 3A, the sub-pixel region P and the first opening O are both in a shape of a rectangle. In this case, in the sub-pixel region P, the light transmission region B and the light-emitting region C may be sequentially arranged along a long side of the first opening O.

The first pixel defining structure 121 and the second pixel defining structures 122 may be made of the same material or different materials.

In some embodiments, as shown in FIG. 2B, the second pixel defining structures 122 and the first pixel defining structure 121 are disposed in a same layer. For example, the second pixel defining structures 122 and the first pixel defining structure 121 are integrally formed.

Here, that the second pixel defining structures 122 and the first pixel defining structure 121 are disposed in the same layer means that they are formed through a same patterning process and made of a same material.

For example, a film is formed and patterned with a halftone or gray tone mask through a halftone exposure process, so that the second pixel defining structures 122 and the first pixel defining structure 121 are formed simultaneously. It will be noted that by using the halftone exposure process, the second pixel defining structure 122 and the first pixel defining structure 121 with different thicknesses can be formed simultaneously.

The above patterning process may include a photolithography process, or a process including a photolithography process and an etching process. The photolithography process refers to a process including a film formation (for example, a photoresist film is formed on a film to be patterned through a chemical vapor deposition (CVD) process), an exposure, a development, and the like, and forming a pattern by using a photoresist, a mask, an exposure machine, or the like.

In some examples, the first pixel defining structure 121 and the second pixel defining structure 122 are both made of an organic material. The organic material is, for example, an organic resin material, an acrylic material or a polyimide material.

In some other embodiments, the first pixel defining structure 121 is made of a different material from the second pixel defining structures 122. In this case, the first pixel defining structure 121 and the second pixel defining structures 122 may be formed through different patterning processes.

For example, the first pixel defining structure 121 is made of the organic material, such as the organic resin material, the acrylic material or the polyimide material. For example, the second pixel defining structures 122 are made of an inorganic material including at least one of monohydric or polyhydric metal sulfide, silicon carbide, silicon oxide, aluminum oxide, silicon nitride or silicon oxynitride.

In this case, in the process of forming the first pixel defining structure 121 and the second pixel defining structures 122, for example, an organic photosensitive material film is formed first, and then the organic photosensitive material film is exposed with a mask placed thereon. After that, the exposed organic photosensitive material film is developed, so that the first pixel defining structure 121 is formed. After the first pixel defining structure 121 is formed, an inorganic material film is formed. In turn, a photoresist film is formed on the inorganic material film, then the photoresist film is exposed with another mask and developed, and then the inorganic material film is etched, so that the second pixel defining structures 122 are formed.

For another example, the second pixel defining structures 122 are formed first, and then the first pixel defining structure 121 is formed. The processes are similar to the above processes of forming the first pixel defining structure 121 first and then forming the second pixel defining structures 122, and details will not be repeated here again.

In some embodiments, the second pixel defining structures 122 is made of a transparent material. For example, the transparent material is a transparent organic resin material. For another example, the transparent material is a transparent inorganic material, such as the silicon oxide, the silicon nitride, or the silicon oxynitride.

In some embodiments, at least one of the first pixel defining structure 121 and the second pixel defining structure 122 has a single-layer structure. In some other embodiments, at least one of the first pixel defining structure 121 and the second pixel defining structure 122 has a laminated structure composed of multiple layers.

In some embodiments, the light-emitting functional layer 132 includes a light-emitting layer. Besides the light-emitting layer, the light-emitting functional layer 312 may further include at least one of an election transporting layer (ETL), an electron injection layer (EIL), a hole transporting layer (HTL), or a hole injection layer (HIL). For example, the light-emitting functional layer 312 may have a laminated structure composed of the election transporting layer, the electron injection layer, the light-emitting layer, the hole transporting layer and the hole injection layer that are sequentially stacked.

In some embodiments, as shown in FIGS. 2A to 2C, the first light-emitting device 13A further includes a second electrode 133. The opaque electrode 131, the light-emitting functional layer 132 and the second electrode 133 are sequentially stacked along the thickness direction of the base 11.

It will be noted that, as shown in FIG. 2A, the second electrode 133 is at least located in the light-emitting region C. In this way, a portion of the light-emitting functional layer 312 that corresponds to both the opaque electrode 131 and the second electrode 133 (e.g., a portion of the light-emitting functional layer 312 that is located in the light-emitting region C) can emit light when certain voltages are applied to the opaque electrode 131 and the second electrode 133.

For example, the second electrode 133 is a metal electrode that is transparent or translucent.

In some embodiments, as shown in FIG. 2A to 2C, the opaque electrode 131 is disposed on a surface of the light-emitting functional layer 132 proximate to the base 11. That is, the opaque electrode 131, the light-emitting functional layer 132 and the second electrode 133 are sequentially stacked in a direction away from the base 11.

In this case, the first light-emitting device 13A is a top-emission light-emitting device. In other words, light exits from the first light-emitting device 13A at a side thereof away from the base 11.

In some other embodiments, the opaque electrode 131 is disposed on a surface of the light-emitting functional layer 132 facing away from the base 11, and the second electrode 133 is a transparent electrode. In this case, the first light-emitting device 13A is a bottom-emission light-emitting device. In other words, the light exits from the first light-emitting device 13A at a side thereof proximate to the base 11.

In some embodiments, the opaque electrode 131 serves as an anode, and the second electrode 133 serves as a cathode.

For example, the opaque electrode 131 has a laminated structure composed of an indium tin oxide (ITO) layer, a silver (Ag) layer, and another ITO layer (i.e., an ITO-Ag-ITO laminated structure), so as to reflect light incident on the opaque electrode 131 to a side of the opaque electrode 131 away from the base 11, thereby improving the light extraction efficiency of the transparent display panel 1.

The second electrode 133 is transparent or translucent. For example, the second electrode 133 is a metal layer, such as a silver layer, that is thin enough to be transparent or translucent, so as to allow the light emitted from the light-emitting functional layer 132 to pass through.

In some other embodiments, the opaque electrode 131 serves as a cathode, and the second electrode 133 serves as an anode.

For example, the opaque electrode 131 is a metal electrode, and the second electrode 133 is made of a transparent conductive material such as ITO.

In some embodiments, the first light-emitting device 13A is an organic light-emitting diode (OLED), and the light-emitting layer is made of a small molecule material.

In some other embodiments, the first light-emitting device 13A is a polymer light-emitting diode (PLED), and the material of the light-emitting layer includes a polymer material.

In some embodiments, the light-emitting devices 13A include a plurality of first color light-emitting devices, a plurality of second color light-emitting devices and a plurality of third color light-emitting devices. The first color, the second color and the third color may be three primary colors.

In some embodiments, as shown in FIGS. 2A to 2C, the transparent display panel 1 further includes a plurality of pixel driver circuits disposed on the base 11 and each located in a corresponding sub-pixel regions P. Each pixel driver circuits is electrically connected to a corresponding first light-emitting devices 13A.

In some examples, the pixel driver circuit includes a plurality of thin film transistors (TFT) composed of a driving transistor and at least two switching transistors. The driving transistor has a larger channel width-to-length ratio than that of the switching transistor.

A first electrode 141 of the driving transistor is electrically connected to the opaque electrode 131 of the corresponding first light-emitting device 13A. Here, the first electrode 141 of the driving transistor may be a drain in a case where the driving transistor is a P-type transistor, or the first electrode 141 of the driving transistor may be a source in a case where the driving transistor is an N-type transistor.

In some examples, as shown in FIGS. 2A to 2C, the thin film transistor 14 includes an active pattern 142, a gate insulating pattern 143, a gate 144, a portion of an interlayer insulating layer 145 that is located in a region where the film transistor 14 is located, a second electrode 146 and the first electrode 141. The gate 144, the gate insulating layer 145 and the active pattern 142 are sequentially disposed on the base 11 along a direction away from the base 11. The second electrode 146 and the first electrode 141 are disposed on the active pattern 142 and are in contact with two opposite ends of the active pattern 142, respectively.

In the case where the driving transistor is the P-type transistor, the first electrode 141 may be a drain, and the second electrode 146 may be a source. In the case where the driving transistor is the N-type transistor, the first electrode 141 may be a source, and the second electrode 146 may be a drain.

In some embodiments, as shown in FIGS. 2A to 2C, the transparent display panel 1 further includes a buffer layer 15 disposed between the base 11 and the pixel driver circuits.

In some embodiments, as shown in FIGS. 2A to 2C, the transparent display panel 1 further includes a passivation layer 16 and a planarization layer 17 disposed between the pixel driver circuits and the first light-emitting devices 13A. For example, a material of the passivation layer 16 is an inorganic material, and a material of the planarization layer 17 is an organic material.

In some embodiments, as shown in FIGS. 2A to 2C, the transparent display panel 1 further includes an encapsulation layer 18. For example, the encapsulation layer 18 is an encapsulation film made of materials such as silicon nitride or silicon oxynitride. For another example, the encapsulation layer 18 is an encapsulation glass.

Figure 3B:
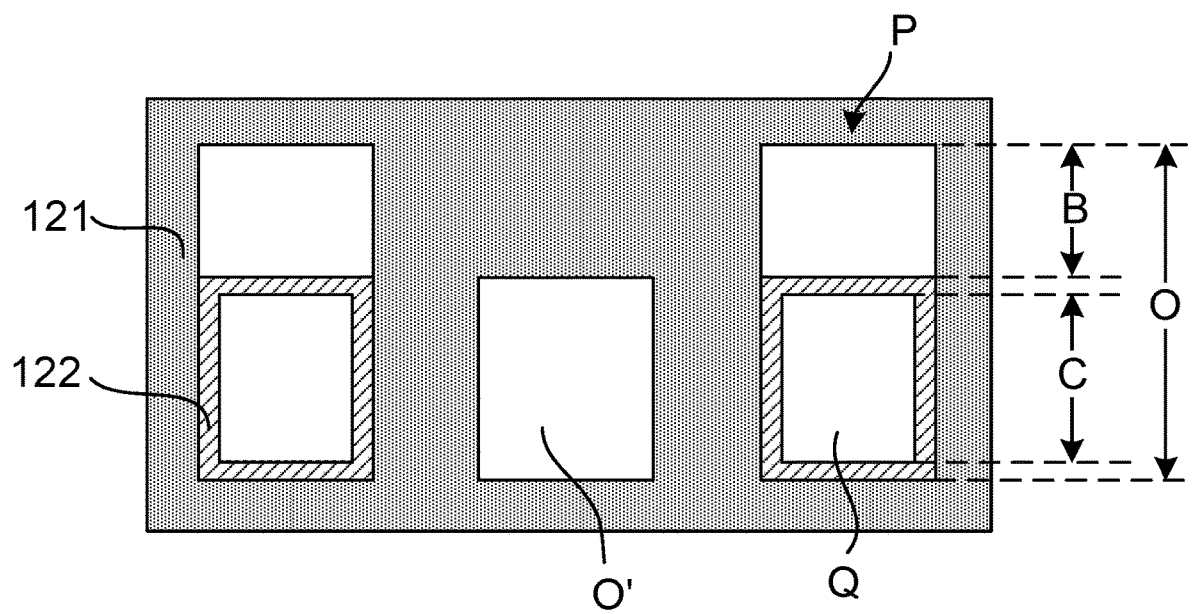
FIG. 3B is a top view showing a third opening in a transparent display panel, in accordance with some embodiments.
Figure 4:
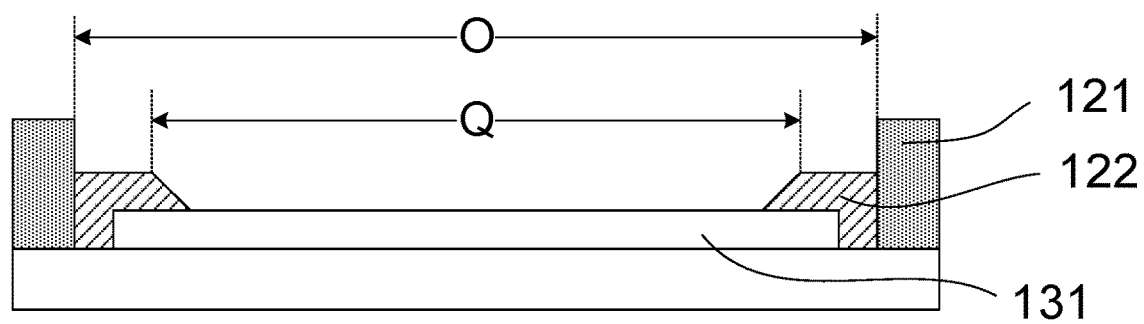
FIG. 4 is a cross-sectional view of the transparent display panel in FIG. 3A taken along the line A-A', in accordance with some embodiments.
Figure 5:
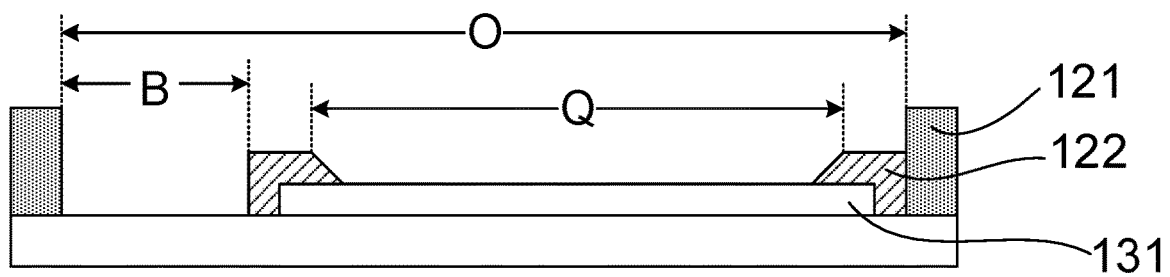
FIG. 5 is a cross-sectional view of the transparent display panel in FIG. 3A taken along the line B-B', in accordance with some embodiments.

In some embodiments, as shown in FIGS. 2C and 3B, the first pixel defining structure 121 further includes a plurality of third openings O', and the transparent display panel 1 further includes at least one second light-emitting device 13B. Each second light-emitting device 13B is disposed in a corresponding sub-pixel region P of the plurality of sub-pixel regions P except sub-pixel regions P where the first light-emitting devices 13A are disposed, and the second light-emitting device 13B corresponds to a third opening O'. The second light-emitting device 13B includes a second opaque electrode 131' and a second light-emitting functional layer 132'. The second opaque electrode 131' and the second light-emitting functional layer 132' are stacked in the thickness direction of the base 11. The second light-emitting functional layer 132' is disposed in the third opening O'. An orthographic projection of the third opening O' on the base 11 is within an orthographic projection of the second opaque electrode 131' on the base 11.

It will be noted that, the sub-pixel region P corresponding to the second light-emitting device 13B is not provided with the light transmission region B therein.

For example, an area of the third opening O' is smaller than that of the first opening O. The area of the third opening O' may be substantially equal to an area of a light-emitting region C of the first opening O.

For another example, the area of the third opening O' is substantially equal to that of the first opening O. In this case, a difference between the second light-emitting device 13B and the first light-emitting device 13A is that a light-emitting area of the second light-emitting device 13B is greater than a light-emitting area of the first light-emitting device 13A.

For example, as shown in FIG. 1B, sub-pixel regions P each of which is provided with a first opening O having a light transmission region B and a light-emitting region C therein, and sub-pixel regions P each of which is only provided with a third opening O' corresponding to a light-emitting region C therein are arranged alternatively.

With regard to a structure of the second light-emitting device 13B which is the same as a structure of the first light-emitting device 13A, reference may be made to the above description of the first light-emitting device 13A, and details will not repeated herein again.

Figure 6:
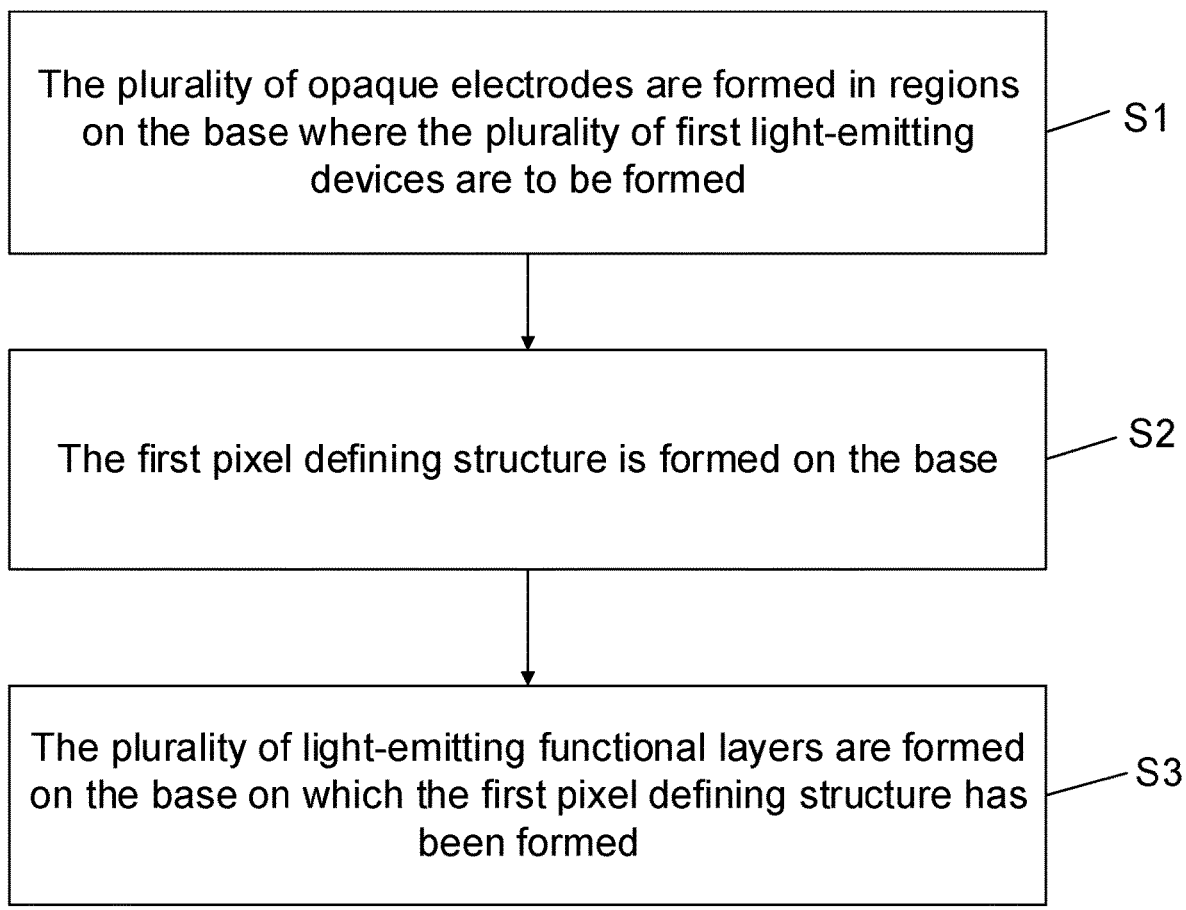
FIG. 6 is a flow diagram of a method for manufacturing a transparent display panel, in accordance with some embodiments.

Some embodiments of the present disclosure provide a method for manufacturing a transparent display panel, which may be used to manufacture the transparent display panel 1 described above. As shown in FIG. 6, the method includes the following S1 to S3.

In S1, with reference to FIGS. 1A to 2B, the plurality of opaque electrodes 131 are formed in regions on the base 11 where the plurality of first light-emitting devices 13A are to be formed, and an orthographic projection of each opaque electrode 131 on the base 11 does not overlap with a corresponding light transmission region C.

In S2, the first pixel defining structure 121 is formed on the base 11. The first pixel defining structure 121 includes the plurality of first openings O, and each first opening O is located in a respective one of the at least part of the sub-pixel regions P.

In S3, the plurality of light-emitting functional layers 132 are formed on the base 11 on which the first pixel defining structure 121 has been formed, so as to form the plurality of first light-emitting devices 13A. Each light-emitting functional layer 132 is located in a corresponding first opening O. An orthographic projection of a corresponding opaque electrode 131 on the base 11 and an orthographic projection of the light-emitting functional layer 132 on the base 11 have an overlapping region, and at least a portion of the overlapping region is within a corresponding light-emitting region C.

For example, a light-emitting functional layer 132 is formed in each first opening O through an inkjet printing process.

Beneficial effects of the method described above are the same as beneficial effects of the transparent display panel 1, and details will not be repeated herein again.

Figure 7:
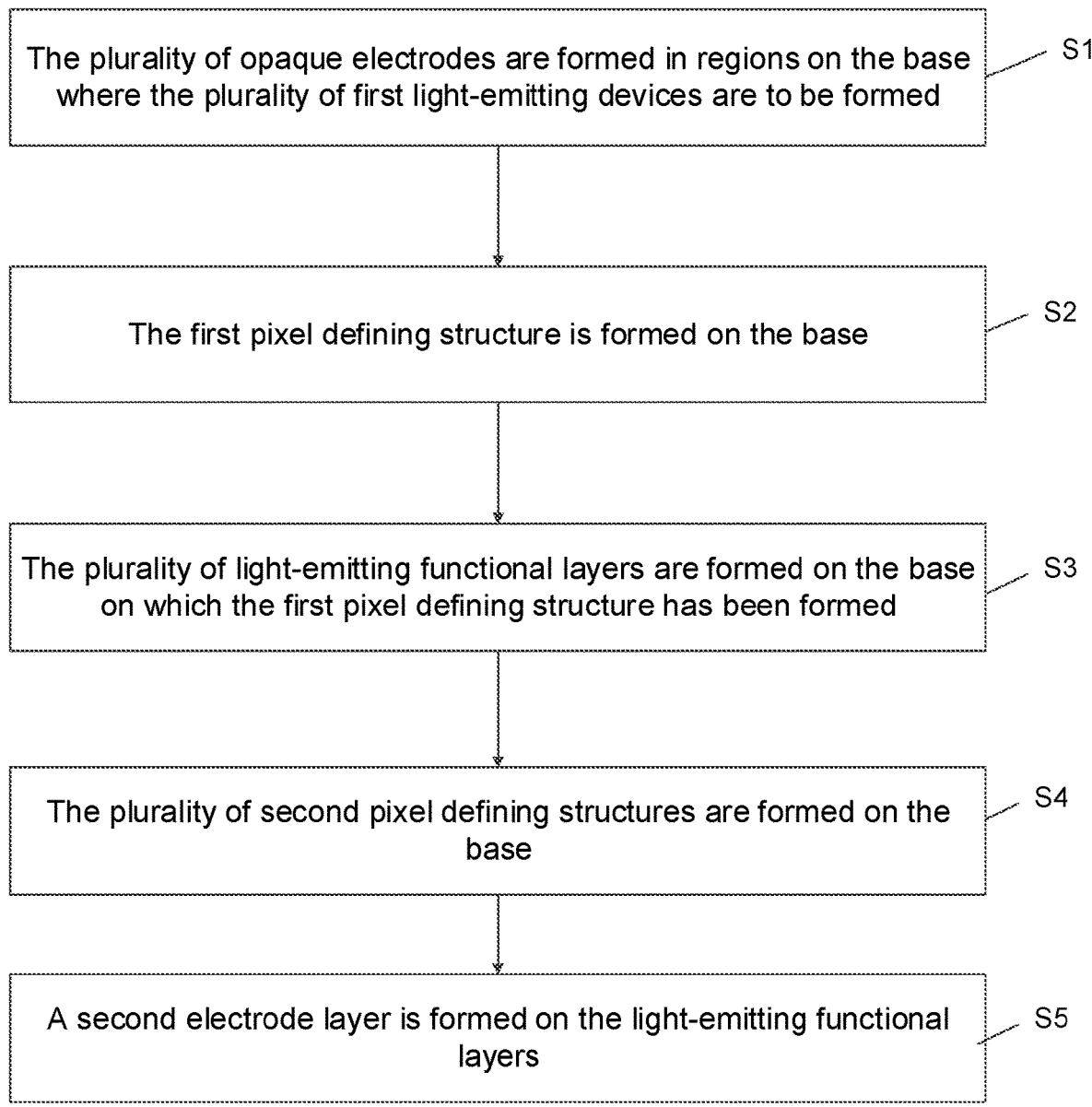
FIG. 7 is a flow diagram of a method for manufacturing another transparent display panel, in accordance with some embodiments.

In some embodiments, as shown in FIG. 7, the method further includes S4.

In S4, with reference to FIGS. 2B, 3A, 3B, 4 and 5, the plurality of second pixel defining structures 122 are formed on the base 11. Each second pixel defining structure 122 is located in a corresponding first opening O, and includes a second opening Q. An orthographic projection of each opaque electrode 131 on the base 11 is within an orthographic projection of a corresponding second opening Q on the base 11, and a region in the corresponding first opening O that is not occupied by both the second pixel defining structure 122 and the opaque electrode 131 is within a corresponding light transmission region B. In the thickness direction of the base 11, a thickness of at least a portion of the second pixel defining structure 122 that is between a corresponding light-emitting region C and the corresponding light transmission region B is less than a thickness of the first pixel defining structure 121, and a thickness of the second pixel defining structure 122 is larger than a thickness of the corresponding opaque electrode 131.

In some embodiments, the first pixel defining structure 121 and the second pixel defining structures 121 are formed through a patterning process, which means that S2 and S4 are performed simultaneously. In this case, the first pixel defining structure 121 and the second pixel defining structures 121 can be made of the same material and formed integrally.

Figure 8:
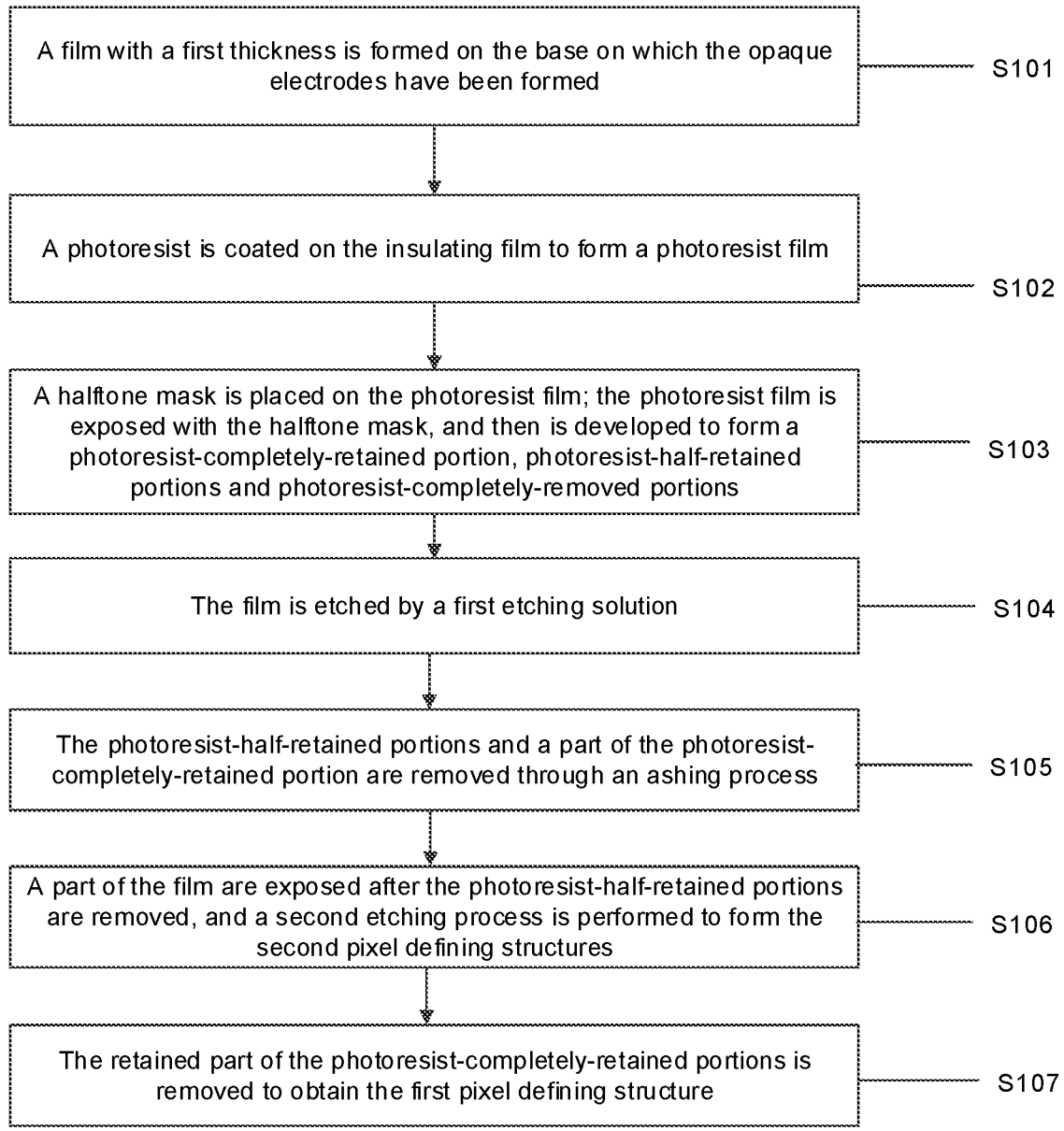
FIG. 8 is a flow diagram of a process of forming a first pixel defining structure and second pixel defining structures in a transparent display panel, in accordance with some embodiments.

For example, as shown in FIG. 8, that the first pixel defining structure 121 and the second pixel defining structures 121 are formed integrally through the patterning process includes the following S101 to S106.

Figure 9:
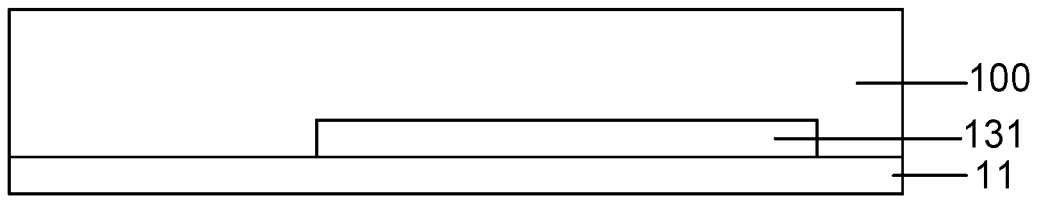
FIGS. 9 to 15 are schematic diagrams showing steps in the process of forming the first pixel defining structure and the second pixel defining structures in the transparent display panel in FIG. 8, in accordance with some embodiments.

In S101, as shown in FIG. 9, a film 100 with a first thickness is formed on the base 11 on which the opaque electrodes 131 have been formed.

Figure 10:
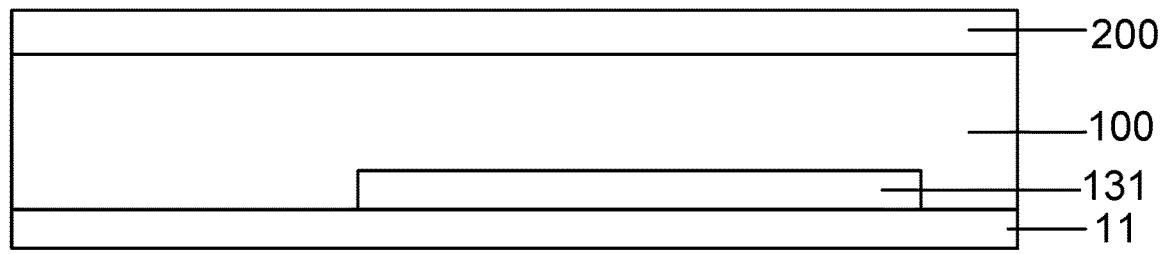

In S102, as shown in FIG. 10, a photoresist is coated on the insulating film 100 to form a photoresist film 200.

Figure 11:
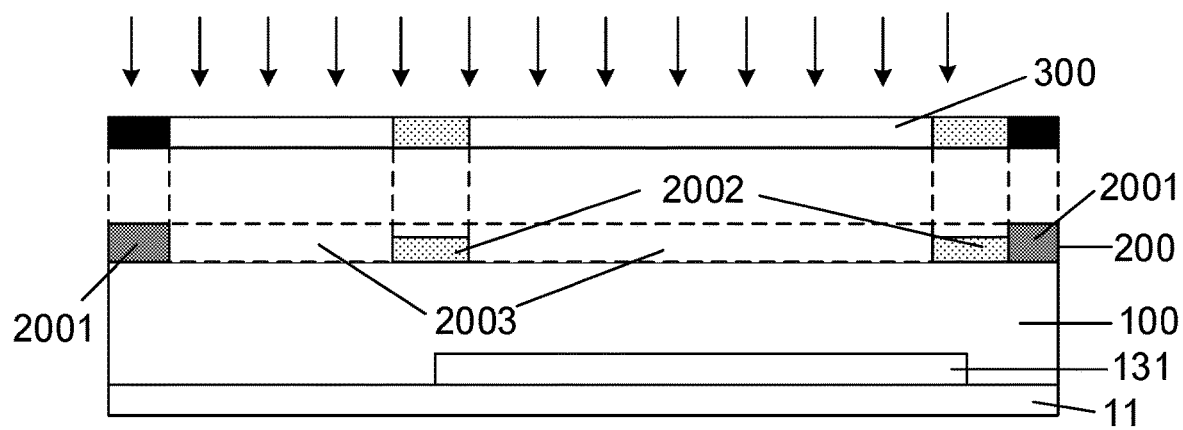

In S103, as shown in FIG. 11, a halftone mask 300 is placed on the photoresist film 200. The photoresist film 200 is exposed with the halftone mask 300, and then is developed to form a photoresist-completely-retained portion 2001, photoresist-half-retained portions 2002 and photoresist-completely-removed portions 2003.

The photoresist-completely-retained portion 2001 corresponds to the first pixel defining structure 121 (to be formed), the photoresist-half-retained portions 2002 correspond to the second pixel defining structures 122 (to be formed), and the photoresist-completely-removed portions 2003 correspond to the first openings and the second openings (to be formed).

Figure 12:
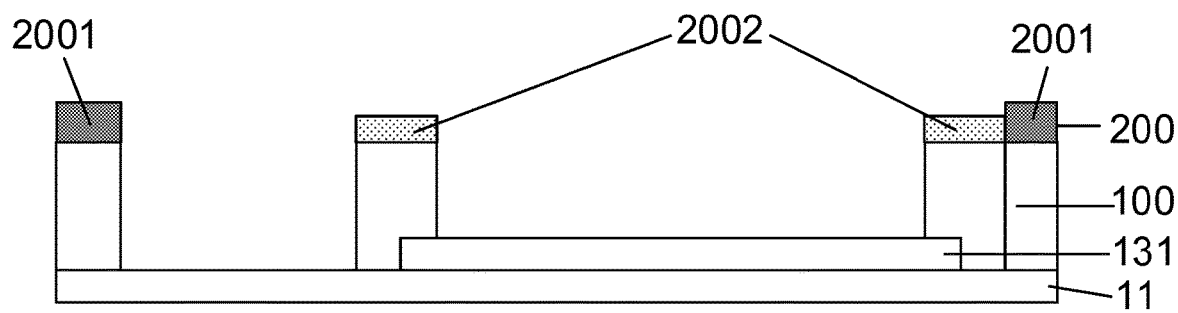

In S104, as shown in FIG. 12, the film 100 is etched by a first etching solution.

Since portions of the film 100 corresponding to the photoresist-completely-removed portions 2003 are exposed in the first etching solution, the exposed portions can be etched and removed, and the first openings and the second openings are formed. Portions of the film 100 corresponding to the photoresist-completely-retained portion 2001 and the photoresist-half-retained portions 2002 are not etched and removed since the first etching solution is prevented by the photoresist-completely-retained portion 2001 and the photoresist-half-retained portions 2002.

Figure 13:
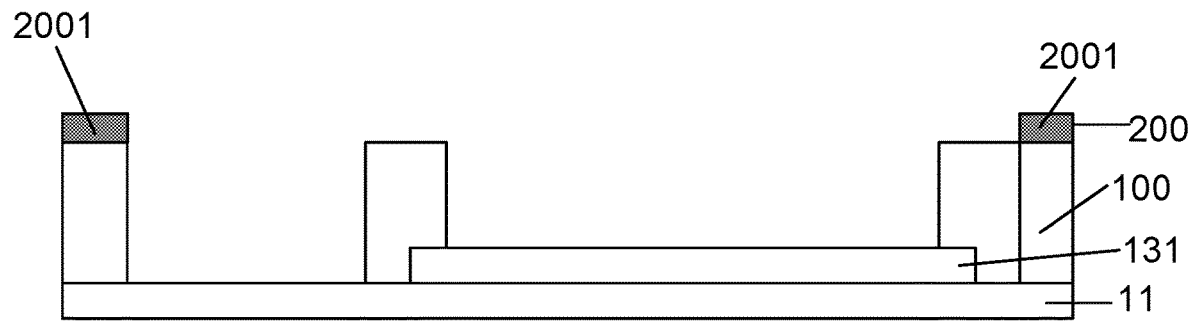

In S105, as shown in FIG. 13, the photoresist-half-retained portions 2002 and a part of the photoresist-completely-retained portion 2001 are removed through an ashing process. It will be understood that, since a thickness of the photoresist-half-retained portions 2002 is less than that of the photoresist-completely-retained portion 2001, when the whole photoresist-half-retained portions 2002 are removed, there is still part of the photoresist-completely-retained portion 2001 retained.

Figure 14:
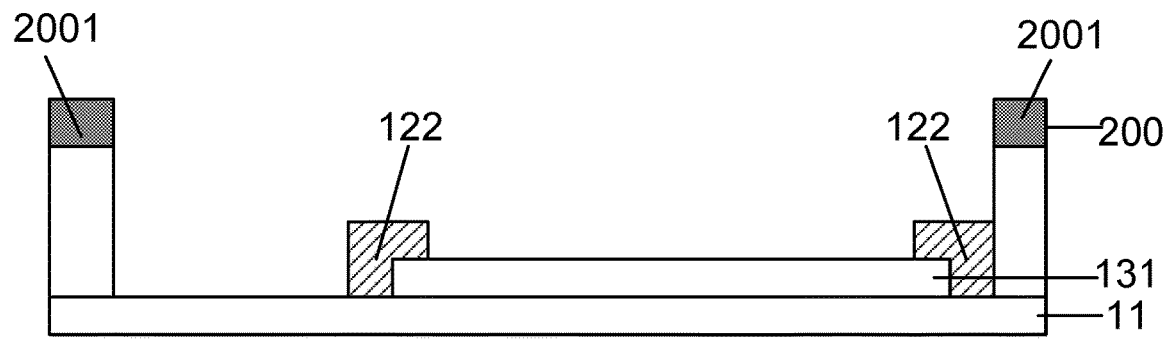

In S106, as shown in FIG. 14, a part of the film 100 are exposed after the photoresist-half-retained portions 2002 are removed, and a second etching process is performed to form the second pixel defining structures 122. It will be noted that, the portions of the film 100 corresponding to the photoresist-completely-retained portion 2001 are still not removed since a second etching solution used in the second etching process is prevented by the retained part of the photoresist-completely-retained portion 2001.

Figure 15:
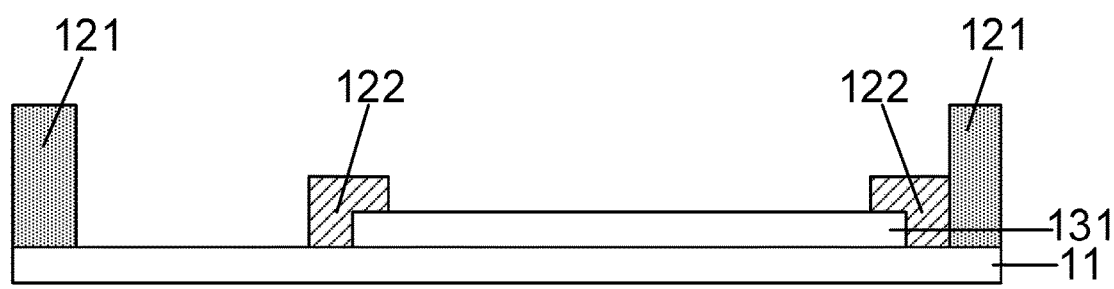

In S107, as shown in FIG. 15, the retained part of the photoresist-completely-retained portions 2001 is removed to obtain the first pixel defining structure 121.

In some other embodiments, S1 is first performed, and then S2 is performed. In this case, the plurality of second pixel defining structures 122 are formed in the first openings O.

In some embodiments, as shown in FIG. 7, after S3, the method further includes S5.

In S5, a second electrode layer is formed on the light-emitting functional layers 132. The second electrode layer includes a plurality of second electrodes 133 each are belong to a corresponding first light-emitting device 13A.

It will be understood that, in a sub-pixel region P, an opaque electrode 131, a light-emitting functional layer 132 and a second electrode 133 that are stacked constitute a first light-emitting device 13A. Only a portion of the light-emitting functional layer 132 that corresponds to the second opening Q emits light when driven by the opaque electrode 131 and the second electrode 133, and a portion of the light-emitting functional layer 132 extending beyond the second opening Q cannot emit light.

In some embodiments, as shown in FIG. 2C, in a case where the first pixel defining structure 121 further includes the plurality of third openings O', and the transparent display panel 1 further includes the at least one second light-emitting device 13B, the method further includes: forming each second light-emitting device 13B in a corresponding sub-pixel region P of the plurality of sub-pixel regions P except sub-pixel regions P where the first light-emitting devices 13A are located. Each second light-emitting device 13B corresponds to a respective one of the plurality of third openings O', and the second light-emitting device 13B includes a second opaque electrode 131' and a second light-emitting functional layer 132' that are stacked in the thickness direction of the base 11. An orthographic projection of the second light-emitting functional layer 132' on the base 11 is within a corresponding light-emitting region C.

The second light-emitting devices 13B and the first light-emitting devices 13A may be formed simultaneously. In other words, corresponding layers in the second light-emitting devices 13B and the first light-emitting devices 13A may formed through a same process. For example, the opaque electrode 131 of each first light-emitting device 13A and an opaque electrode 131 of each second light-emitting device 13B are formed through a first patterning process, the second electrode 133 of the first light-emitting device 13A and a second electrode 133 of the second light-emitting device 13B are formed through a second patterning process, and the light-emitting functional layer 132 of the first light-emitting device 13A and a light-emitting functional layer 132 of the second light-emitting device 13B are formed through a process, for example, the ink-jet printing process.

It will be noted that the display device provided may be any device that displays moving images (e.g., video) or stationary images (e.g., static images) and text or pictures. It is contemplated that the embodiments may be implemented in or associated with various electronic devices. The various electronic devices include, but not limited to, mobile phones, wireless devices, portable android devices (PADs), handheld or portable computers, global positioning system (GPS) receivers/navigators, cameras, MPEG-4 Part 14 (MP4) video players, video cameras, game consoles, watches, clocks, calculators, TV monitors, flat panel displays, computer monitors, vehicle displays (e.g., odometer displays, etc.), navigators, cabin controllers and/or displays, camera view displays (e.g., displays for rear cameras in vehicles), electronic photos, electronic billboards or indicators, projectors, building structures, packaging and aesthetic structures (e.g., displays for displaying images of a piece of jewelry), etc.

The forgoing descriptions are merely specific implementation manners of the present disclosure, but the protection scope of the present disclosure is not limited thereto. Any changes or replacements that a person skilled in the art could readily conceive of within the technical scope of the present disclosure shall be included in the protection scope of the present disclosure. Therefore, the protection scope of the present disclosure shall be subject to the protection scope of the claims.

What is claimed is:

1. A transparent display panel, comprising:
a base;
a first pixel defining structure disposed on the base, wherein the first pixel defining structure includes a first opening, the first opening has a light transmission region and a light-emitting region;
a first light-emitting device disposed on the base, the first light-emitting device including:
an opaque electrode, at least part of the opaque electrode being exposed by the first opening, and an orthographic projection of the opaque electrode on the base not overlapping with the light transmission region; and
a light-emitting functional layer disposed in the first opening and defined by the first opening, the opaque electrode and the light-emitting functional layer being stacked in a thickness direction of the base, wherein the orthographic projection of the opaque electrode on the base and an orthographic projection of the light-emitting functional layer on the base have an overlapping region, and at least a portion of the overlapping region is within the light-emitting region; and a second pixel defining structure disposed on a side of the opaque electrode away from the base and located in the first opening, wherein the second pixel defining structure includes a second opening exposing the opaque electrode; an orthographic projection of the opaque electrode on the base is within an outer border of an orthographic projection of the second pixel defining structure on the base, and a region in the first opening that is not occupied by both the second pixel defining structure and the opaque electrode is within the light transmission region;

in the thickness direction of the base, a thickness of at least a portion of the second pixel defining structure between the light-emitting region and the light transmission region is less than a thickness of the first pixel defining structure; and a remaining portion of the second pixel defining structure except the portion of the second pixel defining structure between the light-emitting region and the light transmission region is in contact with the first pixel defining structure.

2. The transparent display panel according to claim 1, wherein in the thickness direction of the base, a distance from a surface of the second pixel defining structure facing away from the base to a surface of the base facing the second pixel defining structure is greater than a distance from a surface of the opaque electrode facing away from the base to the surface of the base facing the second pixel defining structure.

3. The transparent display panel according to claim 1, wherein the thickness of the second pixel defining structure is less than the thickness of the first pixel defining structure.

4. The transparent display panel according to claim 1, wherein the second pixel defining structure and the first pixel defining structure are disposed in a same layer.

5. The transparent display panel according to claim 1, wherein the first pixel defining structure is made of an organic material; and the second pixel defining structures is made of an organic material or an inorganic material.

6. The transparent display panel according to claim 1, wherein the second pixel defining structure is made of a transparent material.

7. The transparent display panel according to claim 1, wherein the first light-emitting device further includes a second electrode, and the opaque electrode, the light-emitting functional layer and the second electrode are sequentially stacked in a direction away from the base.

8. The transparent display panel according to claim 7, wherein the second electrode is a metal electrode that is transparent or translucent.

9. The transparent display panel according to claim 1, wherein the first pixel defining structure further includes a third opening; and the transparent display panel further comprises:

a second light-emitting device disposed on the base, the second light-emitting device including:

a second opaque electrode, wherein an orthographic projection of the third opening on the base is within an orthographic projection of the second opaque electrode on the base; and a second light-emitting functional layer, wherein the second opaque electrode and the second light-emitting functional layer are stacked in the thickness direction of the base, and the second light-emitting functional layer is disposed in the third opening and defined by the third opening.

10. A method for manufacturing the transparent display panel according to claim 1, the method comprising:

forming the opaque electrode in a region on the base where the first light-emitting device is to be formed;

forming the first pixel defining structure on the base formed with the opaque electrode;

forming the light-emitting functional layer in the first opening, so as to form the first light-emitting device; and forming the second pixel defining structure on the base before forming the light-emitting functional layer in the first opening.

11. The manufacturing method according to claim 10, wherein the first pixel defining structure and the second pixel defining structure are formed through a same patterning process.

12. The manufacturing method according to claim 10, wherein after forming the light-emitting functional layer in the first opening, the method further comprises:

forming a second electrode on the light-emitting functional layer.

13. The manufacturing method according to claim 10, wherein forming the light-emitting functional layer in the first opening includes:

forming the light-emitting functional layer in the first opening through an inkjet printing process.

14. The manufacturing method according to claim 10, wherein the first pixel defining structure further includes a third opening; and the transparent display panel further includes a second light-emitting device; and the method further comprises:

forming the second light-emitting device in a region on the base except the region where the first light-emitting device is formed, wherein the second light-emitting device includes a second opaque electrode and a second light-emitting functional layer that are stacked in the thickness direction of the base; and the second light-emitting functional layer is disposed in the third opening and defined by the third opening.

15. The manufacturing method according to claim 14, wherein the second light-emitting device and the first light-emitting device are simultaneously formed.

16. A display device, comprising a transparent display panel, wherein the transparent display panel includes:

a base;

a first pixel defining structure disposed on the base, wherein the first pixel defining structure includes a first opening, the first opening has a light transmission region and a light-emitting region;

a first light-emitting device disposed on the base, the first light-emitting device including:

an opaque electrode, at least part of the opaque electrode being exposed by the first opening, and an orthographic projection of the opaque electrode on the base not overlapping with the light transmission region; and a light-emitting functional layer disposed in the first opening and defined by the first opening, the opaque electrode and the light-emitting functional layer being stacked in a thickness direction of the base, wherein the orthographic projection of the opaque electrode on the base and an orthographic projection of the light-emitting functional layer on the base have an overlapping region, and at least a portion of the overlapping region is within the light-emitting region; and a second pixel defining structure disposed on a side of the opaque electrode away from the base and located in the first opening, wherein the second pixel defining structure includes a second opening exposing the opaque electrode; an orthographic projection of the opaque electrode on the base is within an outer border of an orthographic projection of the second pixel defining structure on the base, and a region in the first opening that is not occupied by both the second pixel defining structure and the opaque electrode is within the light transmission region;

in the thickness direction of the base, a thickness of at least a portion of the second pixel defining structure between the light-emitting region and the light transmission region is less than a thickness of the first pixel defining structure; and a remaining portion of the second pixel defining structure except the portion of the second pixel defining structure between the light-emitting region and the light transmission region is in contact with the first pixel defining structure.

* * * * *